(12) United States Patent
Britz

(10) Patent No.: US 10,177,743 B2
(45) Date of Patent: Jan. 8, 2019

(54) SYNTHESIZED INDUCTANCE CIRCUIT

(71) Applicant: Fluke Corporation, Everett, WA (US)

(72) Inventor: William J. Britz, Tulalip, WA (US)

(73) Assignee: Fluke Corporation, Everett, WA (US)

( * ) Notice: Subject to any disclaimer, the term of this patent is extended or adjusted under 35 U.S.C. 154(b) by 90 days.

(21) Appl. No.: 15/205,998

(22) Filed: Jul. 8, 2016

(65) Prior Publication Data

US 2018/0013408 A1    Jan. 11, 2018

(51) Int. Cl.
*H03H 11/04*    (2006.01)
*H03H 11/48*    (2006.01)

(52) U.S. Cl.
CPC ....... *H03H 11/486* (2013.01); *H03H 11/0466* (2013.01); *H03H 11/485* (2013.01); *H03H 2011/0488* (2013.01)

(58) Field of Classification Search
CPC ............. H03H 11/486; H03H 11/0466; H03H 11/485; H03H 2011/0488
USPC .................................................. 327/551–559
See application file for complete search history.

(56) References Cited

U.S. PATENT DOCUMENTS

| | | | |
|---|---|---|---|
| 4,383,230 A | 5/1983 | Manzolini | |
| 5,600,288 A * | 2/1997 | Liu | H03H 11/48 327/552 |
| 7,042,317 B2 * | 5/2006 | Xiao | H03H 11/486 330/257 |
| 7,068,130 B2 * | 6/2006 | Redoute | H03H 11/50 333/214 |
| 7,203,474 B2 * | 4/2007 | Shimada | H04B 1/12 333/167 |

FOREIGN PATENT DOCUMENTS

| | | |
|---|---|---|
| EP | 0 656 542 A2 | 6/1995 |
| EP | 0 656 542 A3 | 6/1995 |
| WO | 2009/077856 A2 | 6/2009 |
| WO | 2009/077856 A3 | 6/2009 |

(Continued)

OTHER PUBLICATIONS

Borg et al., "A Microprocessor-Based Gamma-Ray Spectrometer with Gain Stabilized Single-Channel Analyzers," *Nucl. Instr. Meth. Phys. Res. A238*: 104-110, 1985.

(Continued)

*Primary Examiner* — Dinh T Le
(74) *Attorney, Agent, or Firm* — Seed Intellectual Property Law Group LLP

(57) ABSTRACT

An inductive synthesis circuit that mimics an ideal inductor over a wide range of inductance values, from less than 1 mH to more than 100 H, can be used in place of an inductor in any electrical circuit. One application of a synthesized inductor is in an integrated circuit in which it is impractical to construct a coil of wire. The inductive synthesis circuit is suitable for use in a calibration instrument for testing an inductance meter. The inductive synthesis circuit, together with a resistive synthesis circuit and a capacitive synthesis circuit, can be used to calibrate a multi-meter. Alternatively, the inductive synthesis circuit can be used to mimic an ideal inductor in a filter circuit that includes an inductor component, such as a high pass filter, a notch filter, or a band pass filter.

17 Claims, 3 Drawing Sheets

(56) References Cited

FOREIGN PATENT DOCUMENTS

WO    2009/077856 A4    6/2009

OTHER PUBLICATIONS

Extended European Search Report, dated Nov. 28, 2017, for European Application No. 17180279.6-1810, 12 pages.
Khan et al., "Novel technique for immittance simulation—realisation of some all-active simulators," *Int. J. Electron.* 72(3): 1192. (11 pages).
Kumar, U. et al., "Analytical Study of Inductor Simulation Circuits", *Active and Passive Elec. Comp.*, 1989, vol. 13, pp. 211-227.

\* cited by examiner

SYNTHESIZED INDUCTANCE CIRCUIT

BACKGROUND

Technical Field

The present disclosure generally relates to precision inductors for use in electronic circuits.

Description of the Related Art

A synthesis circuit is a circuit whose behavior mimics the behavior of an electrical component, such as a resistor, capacitor or inductor. When a synthesis circuit is placed in a black box and exposed terminals of the black box are stimulated or measured, the electrical performance of the black box is substantially indistinguishable from the component that is being synthesized. Thus, the synthesis circuit can be substituted for an electrical component in any electrical circuit.

One application of synthesis circuits is in calibration instruments that are used to test integrity of electrical measuring equipment, such as ammeters, voltmeters, ohm-meters, multi-meters, and the like. In general, calibration of such an electric meter, or any other measurement tool, entails substituting a calibration standard having known properties in place of a subject device that would be under test, to reveal whether or not the measurement is accurate, or whether the measurement tool is in need of adjustment. For calibration of electric meters in particular, a synthesized calibration instrument can be used as a calibration standard. Thus, a calibration instrument including a synthesis circuit that mimics an ideal resistor can be used to calibrate an ohm-meter. Likewise, a calibration instrument including a synthesis circuit that mimics an ideal capacitor can be used to calibrate a capacitance meter.

BRIEF SUMMARY

An inductive synthesis circuit that mimics an ideal inductor can be used in place of an inductor in any electrical circuit. One application of a synthesized inductor is in an integrated circuit in which it is impractical or inconvenient to construct a coil of wire. An inductive synthesis circuit that behaves as an ideal inductor over a wide range of inductance values is suitable for use in a calibration instrument for testing an inductance meter. The inductive synthesis circuit, together with a resistive synthesis circuit and a capacitive synthesis circuit, can be used to calibrate an L-C-R meter or a multi-meter having L-C-R functions. The inductive synthesis circuit can also be used to mimic an ideal inductor in a signal processing circuit that includes an inductor component, such as a high pass filter, a notch filter, a band pass filter, or the like. Alternatively, a model of the inductive synthesis circuit can mimic an ideal inductor in circuit simulations.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "In an embodiment" or "in an embodiment" in various places throughout the specification are not necessarily all referring to the same aspect. Furthermore, the particular features, structures, or characteristics may be combined in any suitable manner in one or more aspects of the present disclosure.

Specific embodiments are described herein with reference to inductive synthesis circuits that have been produced; however, the present disclosure and the reference to certain materials, dimensions, and the details and ordering of method steps are exemplary and should not be limited to those shown.

Figure 1:
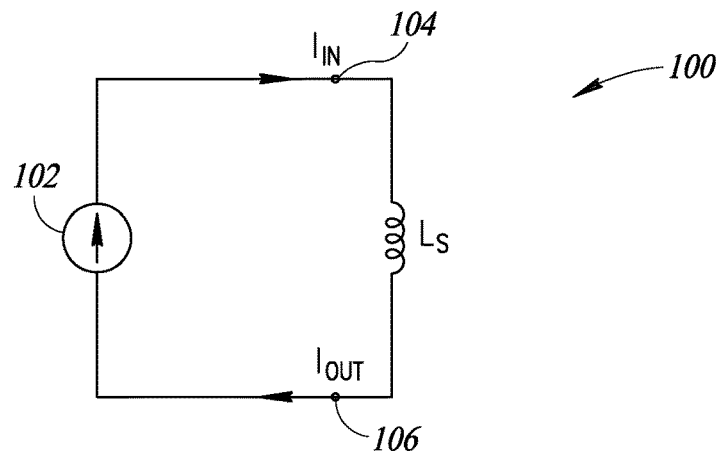
FIG. 1 is a circuit schematic of a synthesized inductor $L_S$ coupled to a current supply.

Turning now to the Figures, FIG. 1 shows a generic voltage follower circuit 100. The generic inductance circuit 100 includes a current source 102 and an inductive load $L_s$ coupled to the current source 102 at an input terminal 104 and an output terminal 106. In embodiments of the present disclosure, the inductive load $L_s$ is a synthesized inductance formed from other, non-inductive circuit elements.

Figure 2:
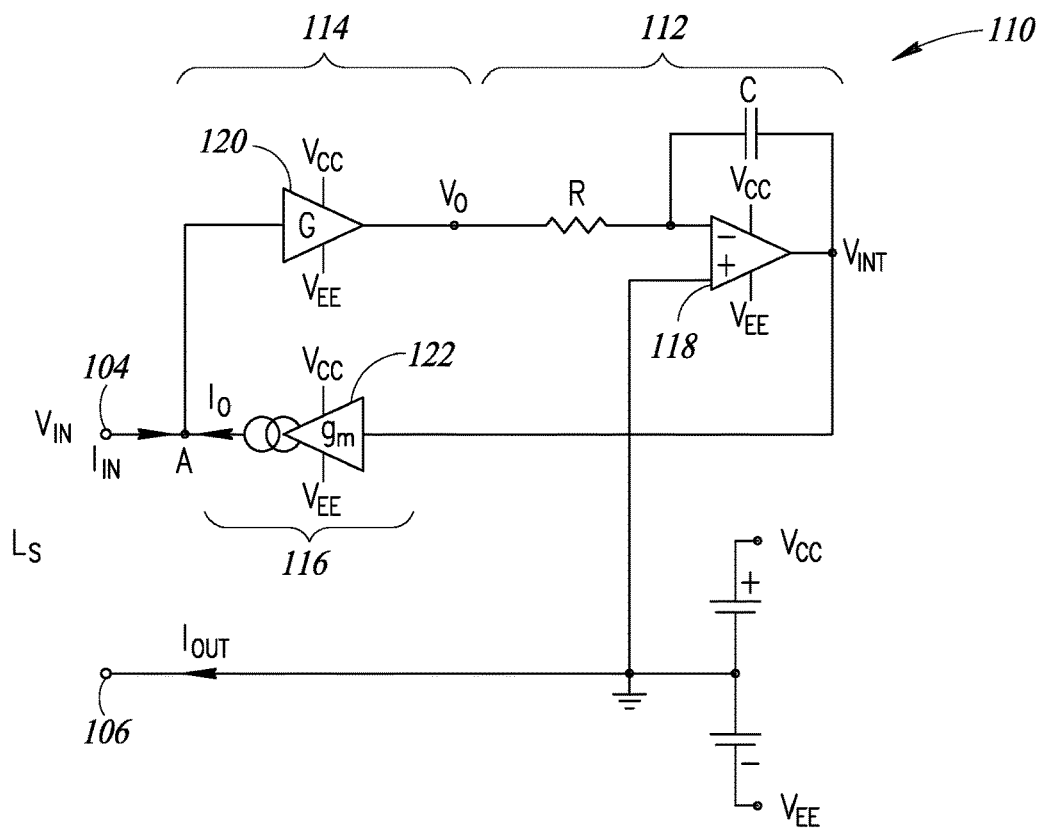
FIG. 2 is a circuit schematic of an inductive synthesis circuit, according to an embodiment as described herein.

FIG. 2 shows a synthesized inductor circuit 110, according to an embodiment of the present disclosure. The synthesized inductor circuit 110 can be substituted for the inductive load $L_s$ in the generic inductance circuit 100. According to one embodiment of the present disclosure, the synthesized inductor circuit 110 includes an RC integrator stage 112, a voltage amplifier stage 114 having a gain G, and a transconductance amplifier stage 116 having a gain $g_m$, arranged in a loop. The voltage amplifier stage 114 and the transconductance amplifier stage 116 are both implemented as either inverting or non-inverting amplifiers.

The RC integrator stage 112 includes an operational amplifier (op-amp) 118 that has a capacitor C in a feedback loop. The op-amp 118 is coupled to a positive power supply $V_{CC}$ and a negative power supply $V_{EE}$. A positive input terminal of the op-amp 118 is grounded. A negative input terminal of the op-amp 118 accepts an input current through an input resistor R. The output signal of the RC integrator stage 112 has a voltage $V_{INT}$, given by $$V_{INT} = \frac{-GV_{IN}}{j\omega RC} \quad (1)$$

in which $j\omega$ is the complex frequency of operation of the inductive synthesis circuit 110.

The voltage amplifier stage 114 includes an variable gain amplifier 120 configured to amplify an input voltage between the positive and negative terminals by a gain factor G such that $V_o = GV_{IN}$. The gain factor G can have any positive value. It is noted that the input voltage is the voltage at an input node A. The variable gain amplifier 120 is powered by the positive power supply $V_{CC}$ and the negative power supply $V_{EE}$. The output of the voltage amplifier stage 114 is fed directly into the RC integrator stage 112.

The non-inverting transconductance amplifier stage 116 includes an op-amp 122 having a gain factor $g_m$, in units of conductance, $I_{out}/V_{in}$. The op-amp 122 is coupled to the positive power supply $V_{CC}$ and the negative power supply $V_{EE}$. The output signal of the RC integrator stage 112 feeds directly into a positive input terminal of the op-amp 122. The output current $I_o$ of the non-inverting transconductance amplifier stage 116 feeds into the negative input terminal of the op-amp 120 via the input node A. The non-inverting transconductance amplifier stage 116 can include any op-amp 122 that supplies, at its output terminal, an output current $I_o$ that is proportional to the input voltage. In the present configuration, $I_o = g_m V_{INT} = -I_{IN}$.

The input impedance of the inductive synthesis circuit 110 increases with frequency according to $$Z_{IN} = \frac{V_{IN}}{I_{IN}} = j\omega \frac{RC}{g_m G} \quad (2)$$

The inductive synthesis circuit 110 corresponding to equation (2) behaves as an ideal inductor having a synthesized inductance $L_s = j\omega L$ given by $$L_s = \frac{RC}{g_m G} \quad (3)$$

The synthesized inductance $L_s$ is produced between a node in the loop, e.g., the input node A, and a reference node, e.g., ground. By varying the values of C, G, and $g_m$, a wide range of inductor values can be accurately synthesized, from less than 1 mH to more than 100 H. The variable gain amplifier 120 can be realized using a 4-quadrant CMOS Digital to Analog Converter (DAC) and operational amplifier, to permit fine adjustment of the gain, G.

If the power supplies $V_{CC}$ and $V_{EE}$ are galvanically isolated from earth and other grounds, the synthesized inductor 110 can be substituted for an inductor $L_s$ in any circuit. Inductors are often used in oscillator circuits and filter circuits for selecting certain oscillation frequencies in signal processing applications. Some examples of filter circuits in which the inductive synthesis circuit 110 is used as the inductor $L_s$ are given below.

Figure 3A:
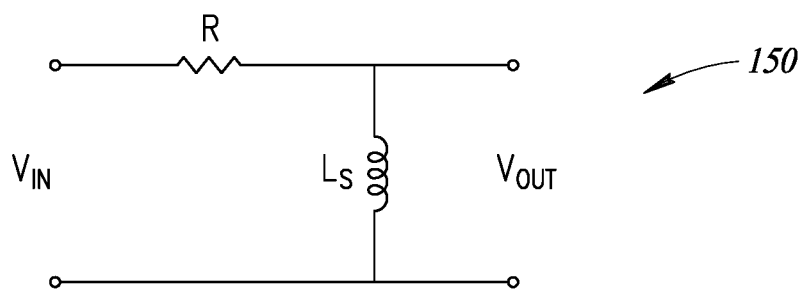
FIG. 3A is a circuit schematic of a high pass filter that includes the inductive synthesis circuit in place of a conventional inductor, according to an embodiment as described herein.

FIG. 3A shows a high pass filter 150, according to an embodiment of the present disclosure. The high pass filter 150 filters out low frequency components of an input signal having a voltage $V_{IN}$, as is well understood in the art of signal processing. The high pass filter 150 includes a resistor R and the inductive synthesis circuit $L_s$, as shown in FIG. 2, in place of a conventional inductor. When the high pass filter 150 is built using the inductive synthesis circuit $L_s$, the inductive synthesis circuit $L_s$ will exhibit characteristics of an ideal inductor. Alternatively, a description of the inductive synthesis circuit $L_s$ can be coded as a set of instructions that embody a circuit simulation, executable by a microprocessor to model various types of circuits. In a simulation of the high pass filter 150, $L_s$ can be specified as the arrangement of operational amplifiers shown in FIG. 2, in place of a simple inductor. The results of such a circuit simulation will be substantially equivalent to results for a high pass filter obtained by specifying an ideal inductor coil.

Figure 3B:
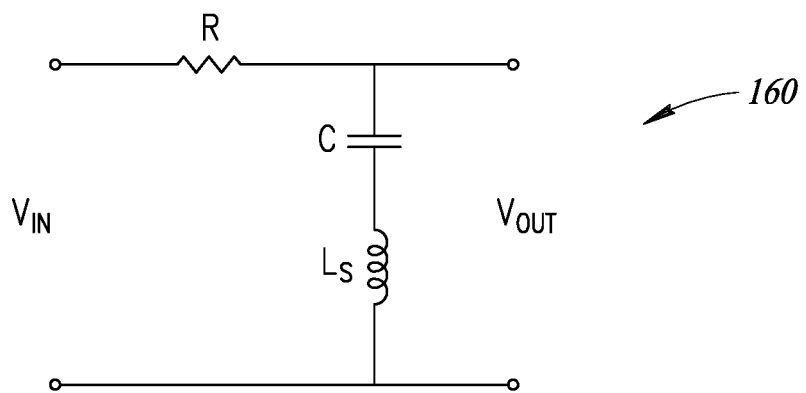
FIG. 3B is a circuit schematic of a notch pass filter that includes the inductive synthesis circuit in place of a conventional inductor, according to an embodiment as described herein.

FIG. 3B shows a notch filter 160, according to an embodiment of the present disclosure. The notch filter 160 attenuates or blocks a narrow band of frequency components of an input signal having a voltage $V_{IN}$, as is well understood in the art of signal processing. The notch filter 160 includes a resistor R, a capacitor C, and the inductive synthesis circuit represented by $L_s$, as shown in FIG. 2, in place of a conventional inductor. When the notch filter 160 is built using the inductive synthesis circuit $L_s$, and coupled to an AC input voltage source, the inductive synthesis circuit $L_s$ will exhibit characteristics of an ideal inductor. Alternatively, when the notch filter 160 is specified in a microprocessor-executable circuit simulation, $L_s$ may be specified as the arrangement of operational amplifiers shown in FIG. 2, in place of a simple inductor. The results of such a circuit simulation will be substantially equivalent to results for a notch filter obtained by specifying an ideal inductor coil.

The inductive synthesis circuit 110 provides an adjustable, precise, and stable inductance for use in calibrating inductance measuring instruments. Historically, inductance measuring instruments have been calibrated using collections of fixed value standard inductors. These inductors have parasitic elements, such as series resistance and inter-winding capacitance that limits their usability over narrow frequency ranges. Some of these non-ideal effects must be characterized at several frequencies to allow for accurate inductance values at several measurement frequencies. Additionally, the larger inductor values require cores made of magnetic material, such as ferrous metals, which increases their size and weight, limiting the number of values that can practically be included in a calibrator.

By changing the gains, G and $g_m$, and the capacitor C in the inductive synthesis circuit 110, a large range of inductance values can be realized in a circuit that is light and compact and will accurately simulate inductance without a need for characterization over a wide range of frequencies.

Figure 4:
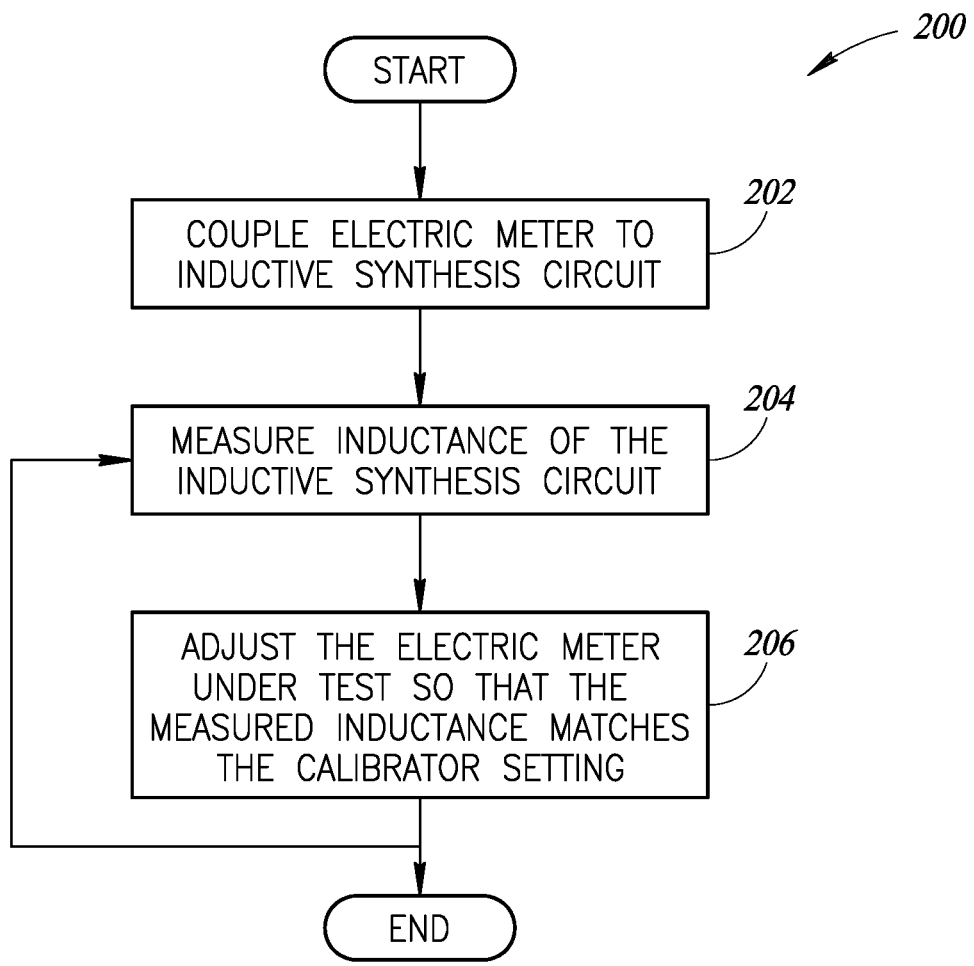
FIG. 4 is a flow diagram for a calibration method that uses the inductive synthesis circuit.

FIG. 4 shows steps in a method 200 of calibrating an electric meter using the inductive synthesis circuit 110 as a calibration standard, according to an embodiment of the present disclosure. Typically, electric meters are capable of measuring either one electrical parameter, e.g., a dedicated inductance meter, or multiple electrical parameters, e.g., a multi-meter that measures one or more of resistance, capacitance, inductance, voltage, current, and power.

Meters may be calibrated by measuring a standard, i.e., a component meter having a known value. For example, an inductance meter can be calibrated by measuring an inductor having a known and reliable inductance that qualifies as a standard. Likewise, an L-C-R meter can be calibrated using standard, known values for inductance, capacitance, and resistance. However, it may be challenging to provide such standards, especially an inductance standard.

The method 200 can be used to calibrate an inductance measurement function of an electric meter using a calibration instrument that accurately and reliably synthesizes an inductor to within a tolerance that is less than the accuracy of the meter being calibrated. Once the synthesized inductor $L_s$ is characterized, it can be directly used as an inductance standard. The method 200 proceeds as follows:

At block 202, an electric meter under test is coupled to a calibration instrument that includes an inductive synthesis circuit, for example, the inductive synthesis circuit 110 shown in FIG. 2. The calibration instrument may be equipped with a conventional resistive synthesis circuit and a conventional capacitive synthesis circuit, as known in the art, in addition to the inductive synthesis circuit 110 as described herein.

At block 204, the meter is set to an inductance mode and the calibrator is set to output a selected inductance value, e.g., 1 pH, as a calibration setting. A measurement is made of the inductance of the inductive synthesis circuit 110 using the electric meter.

At block 206, the electric meter is adjusted so that the inductance measurement obtained using the electric meter substantially matches the known inductance produced by the inductive synthesis circuit 110, i.e., the calibration setting.

It will be appreciated that, although specific embodiments of the present disclosure are described herein for purposes of illustration, various modifications may be made without departing from the spirit and scope of the present disclosure. The various embodiments described above can be combined to provide further embodiments. Aspects of the embodiments can be modified, if necessary to employ concepts of various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A synthesized inductor, comprising:
    an input node and an output node;
    a non-inverting transconductance amplifier coupled to a power supply, the non-inverting transconductance amplifier supplying, at an output terminal, an output current proportional to an input voltage, and the output terminal being coupled to the input node;
    a voltage amplifier coupled to the power supply and coupled to the non-inverting transconductance amplifier via the input node; and
    an integrator coupled to the power supply and coupled in series with an output of the voltage amplifier, wherein an input of the integrator is coupled to the output node and to a reference node.

2. The synthesized inductor of claim 1 wherein the integrator further comprises:
    an operational amplifier coupled to the power supply, the operational amplifier having positive and negative input terminals and an output terminal;
    a capacitor coupled between the negative input terminal and the output terminal; and
    a resistor coupled between the voltage amplifier and the negative input terminal.

3. The synthesized inductor of claim 1 wherein the voltage amplifier is an operational amplifier.

4. The synthesized inductor of claim 3 wherein the operational amplifier has a gain set by a four-quadrant CMOS digital-to-analog converter (DAC).

5. The synthesized inductor of claim 1 wherein the voltage amplifier is a transistor.

6. The synthesized inductor of claim 1 wherein the reference node is a ground terminal, and the synthesized inductor produces a synthesized inductance of known value between the output terminal and the ground terminal.

7. A filter circuit, comprising the synthesized inductor of claim 1 coupled to one or more resistors and one or more capacitors.

8. The filter circuit of claim 7 wherein the filter circuit includes one or more of a notch filter or a band pass filter.

9. A calibration method, comprising:
    coupling an electric meter to an inductive synthesis circuit that includes an input node, a non-inverting transconductance amplifier, a voltage amplifier, an integrator stage, and an output node, the inductive synthesis circuit producing an inductance of known value, wherein:
        the non-inverting transconductance amplifier is coupled to a power supply, the non-inverting transconductance amplifier supplying, at an output terminal, an output current proportional to an input voltage, and the output terminal being coupled to the input node;
        the voltage amplifier is coupled to the power supply and coupled to the non-inverting transconductance amplifier via the input node; and
        the integrator stage is coupled to the power supply and coupled in series with an output of the voltage amplifier, wherein an input of the integrator stage is coupled to the output node and to a reference node;
    measuring the inductance of the inductive synthesis circuit, using the electric meter;
    determining a difference between the measured inductance and the inductance of known value; and
    adjusting the electric meter so that the measured inductance substantially matches to within a selected tolerance the inductance of known value.

10. The method of claim 9 wherein the non-inverting transconductance amplifier is coupled to the integrator stage and the voltage amplifier.

11. The method of claim 9 wherein the integrator stage includes:
    an operational amplifier having positive and negative input terminals, an output terminal, and a feedback loop coupling the negative input terminal to the output terminal;
    a resistor coupled to the negative input terminal; and
    a capacitor in the feedback loop.

12. A calibration device for use in calibrating electric circuits and circuit components, the calibration device comprising an inductive synthesis circuit that includes a non-inverting transconductance amplifier, a voltage amplifier, and an integrator stage arranged in a loop, the inductive synthesis circuit producing a known synthesized inductance between a node in the loop and a reference node.

13. The device of claim 12, further comprising a resistive synthesis circuit and a capacitive synthesis circuit.

14. The device of claim 12, wherein the inductive synthesis circuit further comprises a power supply, and the integrator stage includes a capacitive feedback loop and a resistor.

15. The device of claim 14 wherein the resistor is a four-quadrant CMOS digital-to-analog converter.

16. A circuit simulation executable by a microprocessor to model performance of a circuit, the circuit simulation stored in a non-transitory electronic memory coupled to the microprocessor, the circuit simulation comprising:
   a description of one or more inputs to the circuit;
   a description of one or more outputs from the circuit; and
   a description of a synthesized inductor, including:
      a power supply;
      a non-inverting transconductance amplifier coupled to the power supply, the non-inverting transconductance amplifier supplying, at an output terminal, an output current proportional to an input voltage, and the output terminal being coupled to at least one of the one or more inputs to the circuit;
      a voltage amplifier coupled to the power supply and coupled in parallel with the non-inverting transconductance amplifier, an input to the voltage amplifier being coupled to the input to the circuit and to the output terminal of the transconductance amplifier;
      an integrator coupled to the power supply and coupled in series with an output of the voltage amplifier, wherein the integrator includes:
         an operational amplifier coupled to the power supply, the operational amplifier having positive and negative input terminals and an output terminal;
         a capacitor coupled between the negative input terminal and the output terminal; and
         a resistor coupled between the voltage amplifier and the negative input terminal, and
      wherein an input of the integrator is coupled to at least one of the one or more outputs from the circuit and to a reference node.

17. The circuit simulation of claim 16 wherein the circuit is a filter circuit that includes one or more of a band pass filter and a notch filter.

* * * * *